US010679911B2

(12) United States Patent
Pappas et al.

(10) Patent No.: US 10,679,911 B2
(45) Date of Patent: Jun. 9, 2020

(54) REDUNDANT PIXEL ARCHITECTURE IN ILED DISPLAYS

(71) Applicant: Facebook Technologies, LLC, Menlo Park, CA (US)

(72) Inventors: Ilias Pappas, Cork (IE); Sean Lord, Ottawa (CA); Yu-Hsuan Li, Hsinchu (CN)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 15/855,871

(22) Filed: Dec. 27, 2017

(65) Prior Publication Data

US 2019/0181060 A1    Jun. 13, 2019

(30) Foreign Application Priority Data

Dec. 12, 2017  (GR) .............................. 20170100563

(51) Int. Cl.
*H01L 21/66*    (2006.01)
*H01L 25/075*   (2006.01)
*H01L 33/00*    (2010.01)

(52) U.S. Cl.
CPC .......... *H01L 22/22* (2013.01); *H01L 25/0753* (2013.01); *H01L 33/0095* (2013.01)

(58) Field of Classification Search
CPC ....... H01L 22/22; H01L 25/0753; G09G 3/32; G09G 3/2003; G09G 2330/08; G09G 2300/0426; G09G 2300/0452
See application file for complete search history.

(56) References Cited

U.S. PATENT DOCUMENTS

| | | | | |
|---|---|---|---|---|
| 9,437,782 B2* | 9/2016 | Bower | ...................... | G09G 3/32 |
| 9,468,050 B1* | 10/2016 | Rotzoll | ............... | G09G 3/3275 |
| 9,980,341 B2* | 5/2018 | Bower | ................. | H05B 33/089 |
| 10,103,069 B2* | 10/2018 | Bower | .................... | H01L 22/12 |
| 2016/0217720 A1* | 7/2016 | Chaji | ...................... | G09G 3/006 |
| 2018/0007750 A1* | 1/2018 | Meitl | .................. | H01L 27/0288 |
| 2018/0174932 A1* | 6/2018 | Cok | ........................ | H01L 22/22 |
| 2018/0211582 A1* | 7/2018 | Sakariya | .............. | G09G 3/2014 |
| 2018/0254226 A1* | 9/2018 | Iguchi | ..................... | H01L 22/14 |

* cited by examiner

*Primary Examiner* — Jay C Chang
(74) *Attorney, Agent, or Firm* — Fenwick & West LLP

(57) ABSTRACT

Described herein are ILED displays including redundancy in micro-light emitting diode (micro-LED) dies and methods of manufacturing the ILED displays. A micro-LED die emits light of a particular wavelength. The redundancy is added during manufacturing if defective micro-LED dies are identified. Additional micro-LED dies are included in inoperable sub-pixel assemblies to repair the inoperable sub-pixel assemblies that are identified to include defective micro-LED dies. An ILED display therefore includes at least one repaired sub-pixel assembly that includes two defective micro-LED dies and an operable micro-LED die that are coupled to separate branches of a current path from a current source.

20 Claims, 5 Drawing Sheets

404

502
504

REDUNDANT PIXEL ARCHITECTURE IN ILED DISPLAYS

CROSS REFERENCE TO RELATED APPLICATIONS

This application claims the benefit of Greek Application No. 20170100563, filed Dec. 12, 2017, which is incorporated by reference in its entirety.

BACKGROUND

The disclosure relates to inorganic light emitting diode (ILED) displays, and more specifically, to pixel architectures in ILED displays.

Displays are ubiquitous and are a core component of wearable devices, smart phones, tablets, laptops, desktops, TVs and display systems. Common display technologies today range from Liquid Crystal Displays (LCDs) to more recent Organic Light Emitting Diode (OLED) Displays. OLED displays use organic or polymer materials that are sandwiched between two glass planes to produce light. In most portable devices (i.e. battery powered devices) the display uses a majority of the available battery power. Additionally, the most common user complaint for portable devices is insufficient display brightness. To extend battery life and improve brightness levels it is desirable to reduce power consumption and produce higher luminance emission from the light source.

Inorganic light emitting diode (ILED) displays can provide superior battery performance and enhanced brightness compared to OLED (organic light emitting diode) displays. In ILED displays, discrete standard LED dies that are made of inorganic materials are used to produce light. Each pixel of an ILED display includes three individual LED dies, namely, red, green and blue LED dies. However, it is challenging to manufacture smaller displays using this configuration because of smaller areas allocated to individual pixels. Additionally, it is not feasible to assemble many millions of pixels needed for smaller displays using standard assembly and manufacturing techniques. Furthermore, it is difficult and possibly not viable to test individually dies on an ILED wafer. The inevitability of defective LED dies significantly affects the manufacturing yield.

SUMMARY

In one embodiment, a method for manufacturing a display device including sub-pixel assemblies. The method places a primary micro-light emitting diode (micro-LED) in each of the sub-pixel assemblies to create first sub-pixel assemblies. The method identifies second sub-pixel assemblies among the first sub-pixel assemblies, each second sub-pixel assembly with the primary micro-LED that is defective. The method places a first micro-LED in each of the second sub-pixel assemblies responsive to identifying the second sub-pixel assemblies. The method further identifies third sub-pixel assemblies among the second sub-pixel assemblies. Each third sub-pixel assembly is with the primary micro-LED and the first replacement micro-LED that are defective. Responsive to identifying the third sub-pixel assemblies, the method physically severs a current path to the primary micro-LED and the first replacement micro-LED in each of the third sub-pixel assemblies, and places a second replacement micro-LED in each of the third sub-pixel assemblies.

In one embodiment, a display device includes a first sub-pixel assembly and a second repaired sub-pixel assembly. The first sub-pixel assembly includes a defective micro-light emitting diode (micro-LED), a first operable micro-LED connected to a first current source, and a first switch coupled between the first operable micro-LED and the defective LED. The first switch is configured to disconnect the defective micro-LED from the first current source. The second repaired sub-pixel assembly comprises two defective micro-LEDs connected to a branch of a current path physically severed from a second current source, and a second operable micro-LED connected to another branch of the current path connected to the second current source.

In one embodiment, a display device is made by a method that places a primary micro-light emitting diode (micro-LED) in each of the sub-pixel assemblies to create first sub-pixel assemblies. The method identifies second sub-pixel assemblies among the first sub-pixel assemblies, each second sub-pixel assembly with the primary micro-LED that is defective. The method places a first micro-LED in each of the second sub-pixel assemblies responsive to identifying the second sub-pixel assemblies. The method further identifies third sub-pixel assemblies among the second sub-pixel assemblies. Each third sub-pixel assembly is with the primary micro-LED and the first replacement micro-LED that are defective. Responsive to identifying the third sub-pixel assemblies, the method physically severs a current path to the primary micro-LED and the first replacement micro-LED in each of the third sub-pixel assemblies, and places a second replacement micro-LED in each of the third sub-pixel assemblies.

The figures depict embodiments of the present disclosure for purposes of illustration only.

DETAILED DESCRIPTION

Described herein are ILED display architecture that enables repairing of inoperable sub-pixel assemblies and ILED displays that include repaired sub-pixel assemblies using such architecture. At least one repaired sub-pixel assembly includes two defective micro-LED dies and an operable micro-LED die that are coupled to separate branches of a current path from a current source. Additional micro-LED dies are included in sub-pixel assemblies that are identified as defective during manufacturing to repair those sub-pixel assemblies.

Figure 1:
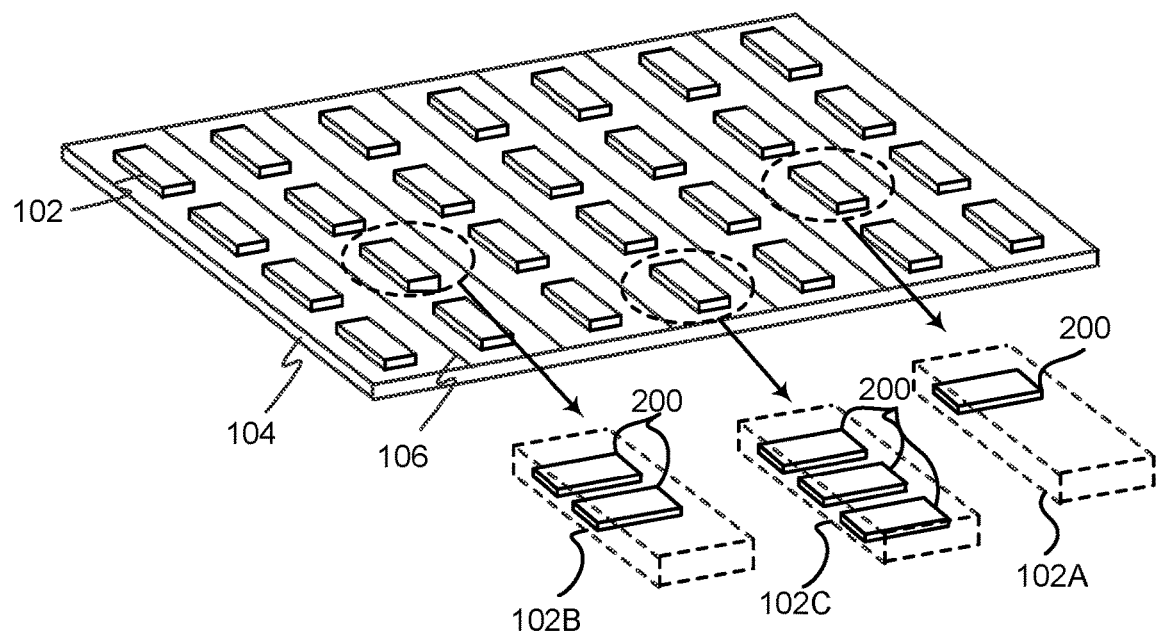
FIG. 1 is a schematic perspective view of a portion of an ILED display, according to one embodiment.

FIG. 1 is a schematic perspective view of a portion of an ILED display 100, according to one embodiment. The ILED display 100 comprises a matrix of sub-pixel assemblies 102. A sub-pixel assembly 102 produces light for a pixel on an image displayed by the display 100. The sub-pixel assembly 102 may be a part of a pixel assembly and emits red light, green light, or blue light. A sub-pixel assembly 102 includes at least one micro-LED die 200. A sub-pixel assembly is coupled to a driving circuitry for driving the sub-pixel assembly to emit light. A micro-LED die may be an inorganic LED (ILED) die. More examples of sub-pixel assemblies are further described with respect to FIGS. 3A through 5C.

Figure 2:
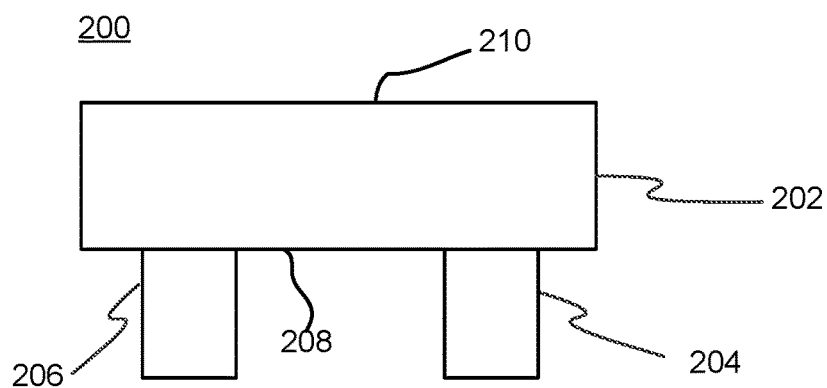
FIG. 2 illustrates a micro-LED die, according to one embodiment.

A micro-LED die is a light emitting element that produces light of a particular wavelength. As illustrated in FIG. 2, a micro-LED die 200 includes a light emitter 202 that produces and emits light. The light emitter 202 includes a p-electrode 204 and an n-electrode 206. In the illustrated example, the p- and n-electrodes 204, 206 are formed on a same surface (e.g., a bottom surface 208) of the micro-LED die 200. Light is output from the opposite surface (e.g., a top surface 210) of the micro-LED die 200.

Referring back to FIG. 1, to provide redundancy, a sub-pixel assembly 102 can include multiple micro-LED dies that emit the same colored light. For example, a sub-pixel assembly 102B corresponding to a red sub-pixel can include two micro-LED dies that are configured to emit red light, one of which is defective. For an ILED display 100, some sub-pixel assemblies (e.g., sub-pixel assembly 102A) include one micro-LED die 200 whereas some sub-pixel assemblies (e.g., sub-pixel assemblies 102B, 102C) include multiple micro-LED dies 200. Accordingly, different sub-pixel assemblies may include different numbers of micro-LED dies depending on whether one or more micro-LED dies in the sub-pixel assemblies are defective. In some embodiments, for a particular colored light, the number of micro-LED dies included in one sub-pixel assembly is limited to three. As further described below with reference to FIGS. 3A through 4C, the number of micro-LED dies included in one sub-pixel assembly is determined based on whether one or more micro-LEDs previously placed in the sub-pixel assembly are defective.

Accordingly, on the same ILED display 100, different pixel assemblies 102 may include different numbers of micro-LED dies. In embodiments where the number of micro-LED dies included in one sub-pixel assembly is limited to three, a pixel assembly consisting of three sub-pixel assemblies can include micro-LED dies that are in the range of three to nine because each sub-pixel can include one to three micro-LED dies.

As illustrated in FIG. 1, the pixel assemblies 102 are assembled onto a display substrate 104. The display substrate 104 can be a silicon or glass panel including a layer of switches such as n-type or p-type TFTs (thin-film transistors) or MOSFETs (metal-oxide-semiconductor field-effect transistors). Electrical circuitries 106 and electrodes (not shown) of the display substrate 104 are formed on the substrate 104. The electrodes of the display substrate 104 are connected to the electrical circuitries 106 which are connected to electrodes of the micro-LED dies in the pixel assemblies. In order to present obfuscation, other components of the ILED display 100 such as a driving IC block, a power module, and the like are not shown.

Figure 3A:
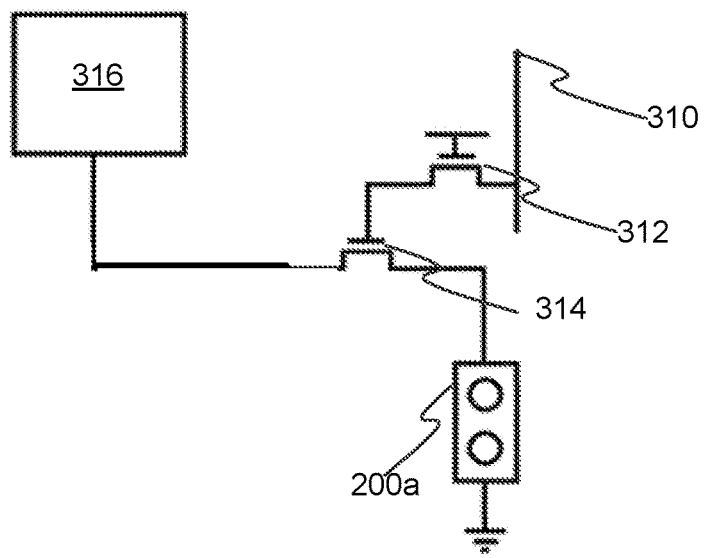
FIGS. 3A through 3C illustrate example sub-pixel assemblies, according to one embodiment.
Figure 3B:
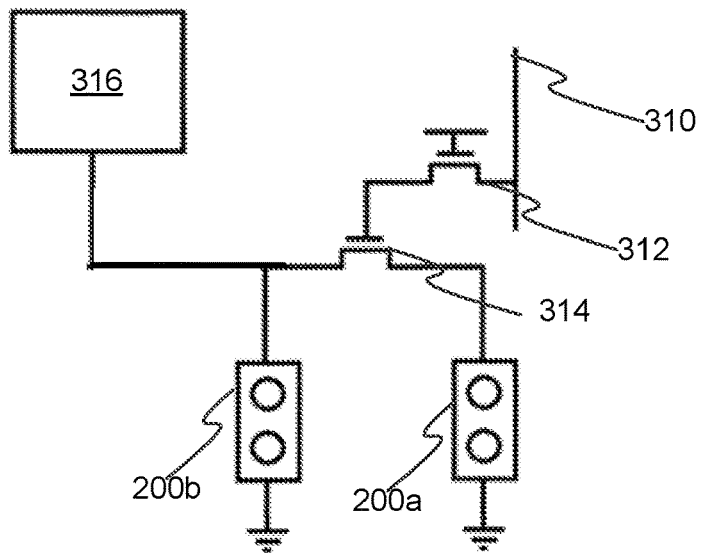
Figure 3C:
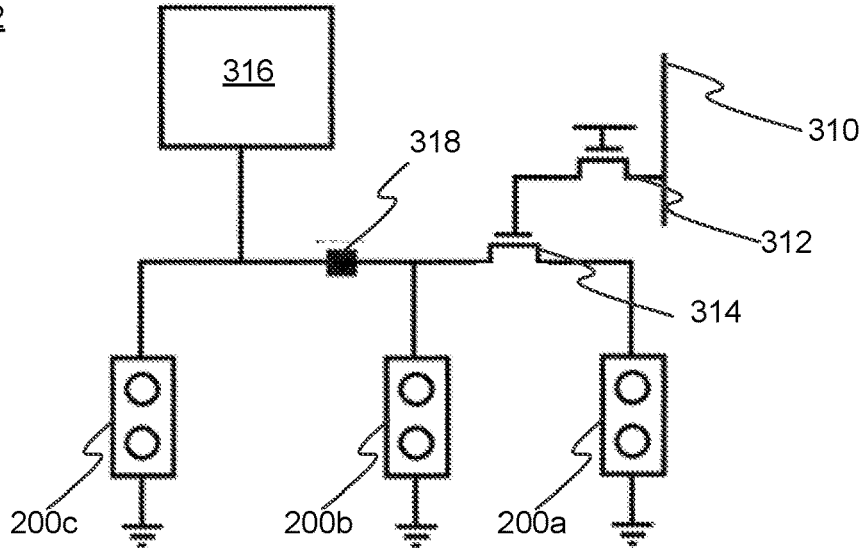

FIGS. 3A through 3C illustrate example sub-pixel assemblies 300 through 302, according to one embodiment. The sub-pixel assembly 300 includes one operative micro-LED die 200a placed during a first pick and place operation of micro-LED dies. A pick and place operation described herein refers to an operation of picking up one or more micro-LED dies from a substrate and placing these micro-LED dies onto a display substrate. Micro-LEDs for producing the same color is generally fabricated on a fabrication substrate. Hence, in order to form a pixel assembly including micro-LED dies producing different colors, these micro-LEDs are picked up from the fabrication substrate or a temporary carrier substrate and then placed onto desired locations on the display substrate. If the micro-LED die 200a is operational, no additional micro-LED dies need to be picked and placed in the circuit of FIG. 3A, and hence, the configuration of FIG. 3A becomes the final configuration of the sub-pixel assembly.

In the example of FIG. 3A, the sub-pixel assembly 300 includes a micro-LED die 200a, a control line 310, a first TFT (thin-film transistor) 312, a second TFT 314, and a driving circuitry 316. The TFTs 312, 314 are switches that can be turned on or off using a bias gate-to-source voltage applied between their respective gate and source.

The TFT 312 is used to control switching on and off of the TFT 314. The TFT 314 is used to control connecting or disconnecting the micro-LED die 200a to the driving circuitry 316. The TFT 312 is controlled by a control signal applied to the gate of the TFT 312. This control signal may be a scan signal used to turn on or off a row of sub-pixel assemblies in a matrix of sub-pixel assemblies. If the TFT 312 is switched off, the TFT 314 is disconnected from the control line 310. If the TFT 312 is switched on, the TFT 314 is connected to the control line 310. A control voltage applied to the control line 310 is applied to the gate of the TFT 314 and this control voltage is programmed to switch on or off the TFT 314. The control voltage applied to the control line 310 is configured to have a value that is determined according to the topology of the sub-pixel assembly. For example, if the micro-LED die 200a is operative such that the sub-pixel assembly is of the topology illustrated in FIG. 3A, the control voltage applied to the control line 310 is configured to have a value to turn on the TFT 314. As another example, if the micro-LED die 200a is detected to be defective during manufacture such that the sub-pixel assembly is of the topology illustrated in FIG. 3B, the control voltage applied to the control line 310 is configured to have a value to turn off the TFT 314. If the TFT 314 is switched on, the micro-LED 200a is connected to the driving circuitry 316. The driving circuitry 316 is controlled by a control logic (not shown) to supply a driving current to drive the micro-LED die 200a to emit light. If the TFT 314 is switched off, the micro-LED 200a is disconnected from the driving circuitry 316.

However, if the micro-LED die 200a turns out to be defective (e.g., not emitting light when turned on, or emitting light when turned off), a repair operation is performed. The repair operations may be performed in multiple levels or sequences, as required. If the micro-LED die 200a of FIG. 3A is identified as being defective, a second pick and place operation is performed to place another micro-LED die 200b as illustrated in FIG. 3B to form sub-pixel assembly 301. The sub-pixel assembly 301 includes the defective micro-LED die 200a, the micro-LED die 200b, the control line 310, the first TFT 312, the second TFT 314, and the driving circuitry 316. The micro-LED die 200b and the micro-LED die 200a are coupled to the opposite terminals of the second TFT 314. That is, one of the drain and source of the TFT 314 is coupled to the micro-LED die 200a and the other is coupled to the micro-LED die 200b.

Compared to the sub-pixel assembly 300 illustrated in FIG. 3A, the sub-pixel assembly 301 illustrated in FIG. 3B includes the micro-LED die 200b added by the second pick and place operation to repair the subpixel assembly 301. The TFT 314 is controlled to prevent the micro-LED die 200a from being connected to the driving circuit 316. For example, an external circuit coupled to the control line 310 is set to send a low voltage (e.g., 0) over the control line 310 so that the TFT 314 is turned off when the TFT 312 is turned on. By turning off the TFT 314, no driving current is provided from the driving circuitry 316 to the defective micro-LED die 200*a*.

If the added micro-LED die 200*b* is also defective, a second repair operation involving third pick and place operation may be performed on the sub-pixel assembly 301 to form a sub-pixel assembly 302, as illustrated in FIG. 3C. In addition to adding the micro-LED die 200*c*, a laser cutting operation is performed at laser cut point 318 to cut off the output line from the driving circuit 316 to the micro-LED 200*b*. Compared to the sub-pixel assembly 301 illustrated in FIG. 3B, the sub-pixel assembly 302 illustrated in FIG. 3C includes the micro-LED die 200*c* for replacing the micro-LED die 200*a* and the micro-LED die 200*b*.

The TFTs 312 and 314 may be of the same type (e.g., amorphous silicon, IGZO, or low temperature polycrystalline silicon TFTs).

Figure 4A:
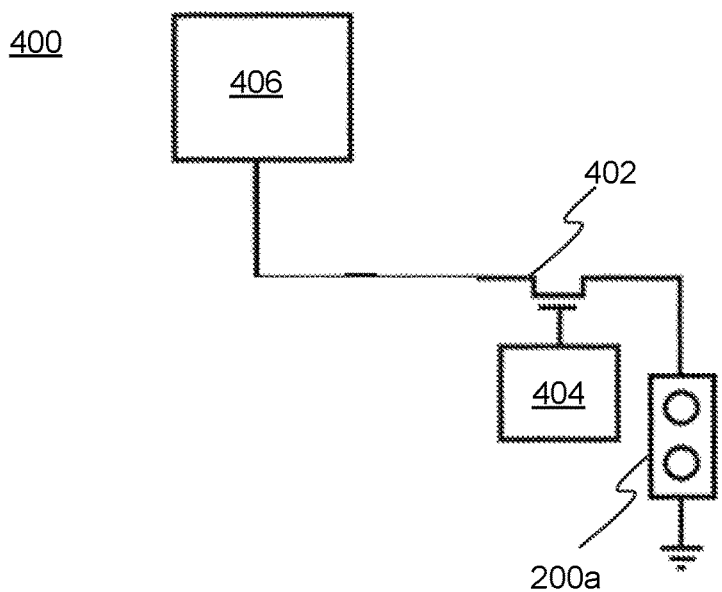
FIGS. 4A through 4C illustrate example sub-pixel assemblies, according to one embodiment.
Figure 4B:
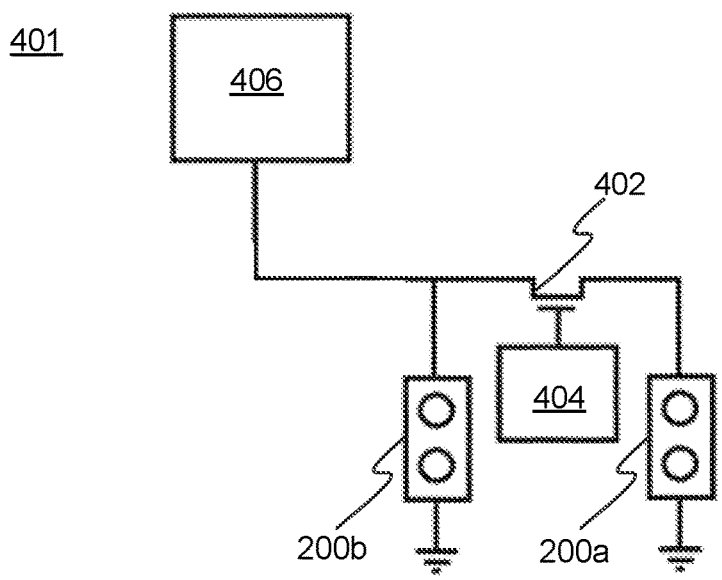
Figure 4C:
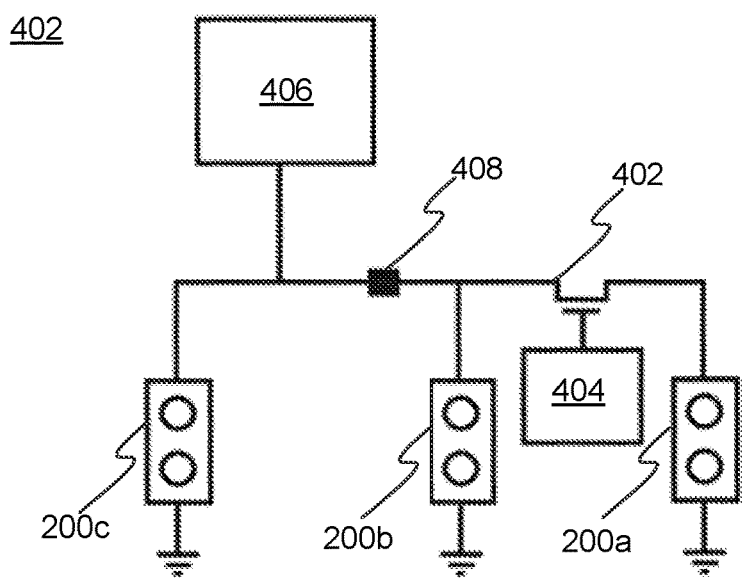

FIGS. 4A through 4C illustrate example sub-pixel assemblies 400 through 402, according to one embodiment. The repairing operations associated with the sub-pixel assemblies 400 through 402 and the circuit structure of FIGS. 4A through 4C are substantially the same as those of FIGS. 3A through 3C except that a single TFT 402 having its gate connected to a memory element 404. The memory element 404 is programmed to store a value (e.g., a bias charge) that either switches on or off the TFT 402. The TFT 402 is used to connect or disconnect the micro-LED die 200*a* to the driving circuitry 406. The memory element can be programmed during display fabrication or be refreshed periodically during the normal operation of the ILED display device 100.

Compared to the embodiments illustrated in FIGS. 3A through 3C, the embodiments illustrated in FIGS. 4A through 4C include fewer components. By including memory elements in individual sub-pixel assemblies, the embodiments illustrated in FIGS. 4A through 4C do not need additional memory elements in driving integrated circuit (IC) blocks. When the memory element is programmed only once, there is no increase in power consumption due to the repair operation.

Figure 5:
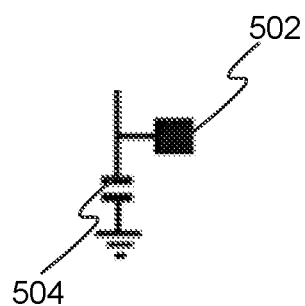
FIG. 5 illustrate an example memory element, according to one embodiment.

FIG. 5 illustrates an example memory element, according to one embodiment. The memory element 404 includes a capacitor 504 and a bias pad 502. The capacitor 504 is coupled between the gate of the TFT 402 and the ground. In addition, the bias pad 502 is coupled to the gate of the TFT 402. The capacitor 504 can be charged via the bias pad 502. The capacitance of the capacitor 504 and the TFT 402 are selected such that the charge stored in the capacitor 504 can be maintained to a threshold level to turn on the switch 402 over a time interval. For example, the charge stored in the capacitor 504 is preferably greater than a threshold to turn on the TFT 402 over the life time of the ILED display.

Figure 6:
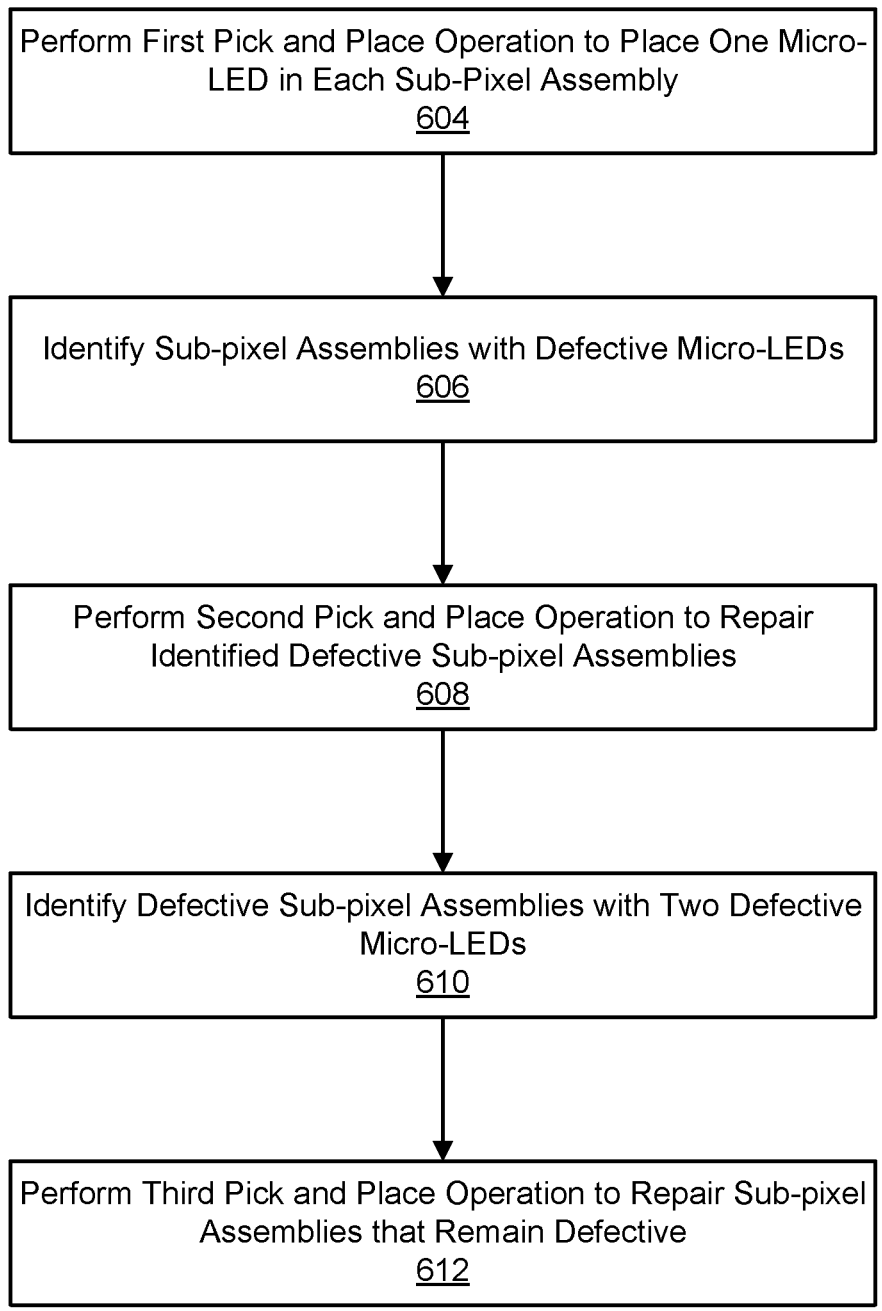
FIG. 6 illustrates an example process of manufacturing an LED display, according to one embodiment.

FIG. 6 illustrates an example process of manufacturing an ILED display, according to one embodiment. The process can involve a single assembly station that performs a plurality of placement cycles (e.g. pick, place, test). The ILED display manufactured according to the illustrated process includes sub-pixel assemblies, some of which may undergo repairing operation.

After micro-LED dies are fabricated on a fabrication substrate, the process performs a first pick and place operation 604 to place a single micro-LED die in each sub-pixel assembly on a display substrate. A sub-pixel assembly includes one micro-LED die. The sub-pixel assemblies 300 and 400 illustrated in FIGS. 3A and 4A, respectively, are example sub-pixel assembly configurations created.

The display substrate includes a semiconductor layer that includes a plurality of switches (e.g., TFTs, MOSFETs) for controlling whether to connect a particular micro-LED die to a driving circuit. The micro-LED dies may be placed on the display substrate such that they form a matrix (e.g., square matrix) of micro-LED dies corresponding to sub-pixel locations on the display. The placement may start from a corner of the ILED display.

The picking and placing may be performed in iterations until all sub-pixel assemblies corresponding to one colored light are formed on the display substrate. The PUT moves sequentially when performing the picking as well as when performing the placing of micro-LED dies. That is, the PUT moves to pick a micro-LED die from the wafer (1) that is adjacent to the micro-LED die that was picked in the previous iteration. The PUT moves to place the micro-LED to a location on the display substrate that is next to the micro-LED die that was placed in the previous iteration.

Then sub-pixel assemblies with defective micro-LEDs are identified 606.

The defective sub-pixel assemblies include defective, missing, or contaminated micro-LED dies. Such defects may be termed "killer defects." For example, the entire display is driven such that all sub-pixel assemblies are turned on to emit light or turned off to emit no light. If a sub-pixel assembly does not emit light when turned on or emits light when turned off, it is identified as a defective sub-pixel assembly. The process may use a camera to identify the defective sub-pixel assemblies. The camera can measure a light profile. If a sub-pixel assembly emits light having an intensity that is less than a threshold intensity corresponding to a driving current, the sub-pixel is determined as defective.

A second pick and place operation may then be performed 608 to place a replacement micro-LED die into each identified defective sub-pixel assembly to repair the identified sub-pixel assemblies. The sub-pixel assemblies 301 and 401 illustrated in FIGS. 3B and 4B, respectively, are example sub-pixel assembly configurations created. Similar to the picking and placing of micro-LEDs to create 604 sub-pixel assemblies, the picking and placing of micro-LEDs to repair 608 defective sub-pixel assemblies may be performed in iterations until all sub-pixel assemblies corresponding to one colored light are formed on the display substrate.

The locations of the replacement micro-LED dies are recorded because the corresponding sub-pixel assemblies are driven in a manner different from the other sub-pixel assemblies that do not include the replacement micro-LED dies. For example, a map of the locations of the micro-LED dies is generated and stored. The map includes information that provides a basis for controlling the sub-pixel assemblies. For example, sub-pixel assemblies that include the replacement micro-LED dies can be identified from the map during a frame programming phase. The sub-pixel assemblies that include the replacement micro-LED dies are controlled such that the replacement micro-LED dies rather than the primary micro-LED dies are turned on in order to enable the sub-pixel assemblies to emit light. For ILED displays that use control signals to turn on or off the sub-pixel assemblies, a control module (e.g., a driving IC block) generates different control signals to control sub-pixel assemblies that include the replacement micro-LED dies and sub-pixel assemblies that include only the primary micro-LED dies. For ILED displays that use memory elements to turn on or off the sub-pixel assemblies, the bias charge stored in the memory elements of the identified sub-pixel assemblies are reversed so that the replacement micro-LED dies rather than the primary micro-LED dies are driven by the driving current.

Then defective sub-pixel assemblies with two defective micro-LED dies are identified 610. That is, an identified sub-pixel assembly includes the primary micro-LED die and the replacement micro-LED die that are both defective. The identification 610 is similar to the identification 606 described above. Details are omitted for brevity.

The process performs a third pick and place operation 612 to place a second replacement micro-LED die into each identified defective sub-pixel assembly to repair the identified sub-pixel assemblies. The second replacement micro-LED dies provide further redundancy. In addition, the process creates laser cut points to provide electrical isolation. The sub-pixel assemblies 302 and 402 illustrated in FIGS. 3C and 4C, respectively, are example sub-pixel assembly configurations created. Similar to the picking and placing performed to create sub-pixel assemblies and to repair defective sub-pixel assemblies, the picking and placing may be performed in iterations until all sub-pixel assemblies corresponding to one colored light are formed on the display substrate.

In addition, the process creates laser cut points at predetermined locations within sub-pixel assemblies identified to include two defective micro-LED dies to provide electrical isolation. In particular, in a sub-pixel assembly, the laser cut point electrically isolates the first replacement micro-LED die and the primary micro-LED die from the driving circuitry. Only the second replacement micro-LED die is connected to the driving circuitry. As such, the second replacement micro-LED dies rather than the primary micro-LED dies or the first replacement micro-LED dies are driven by a driving current in order to turn on the sub-pixel assemblies to emit light.

In some embodiments, the above-described process creates, tests, and repairs sub-pixel assemblies for one colored light. The same process is repeated to create, test, and repair sub-pixel assemblies for the other two colored light. In some embodiments, the above-described process creates sub-pixel assemblies for all three colored light concurrently. Subsequently, the process tests the created sub-pixel assemblies for all three colored light concurrently, and repairs sub-pixel assemblies for all three colored light concurrently.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method for manufacturing a display device comprising sub-pixel assemblies, the method comprising:
    placing a primary micro-light emitting diode (micro-LED) in each of the sub-pixel assemblies to create first sub-pixel assemblies;
    identifying second sub-pixel assemblies among the first sub-pixel assemblies, the primary micro-LED of each second sub-pixel assembly identified as being defective by at least supplying current via a switch;
    responsive to identifying the second sub-pixel assemblies;
        turning off the switch to disconnect supply of the current to the primary micro-LED of each second sub-pixel assembly; and
        placing a first replacement micro-LED in each of the second sub-pixel assemblies;
    identifying third sub-pixel assemblies among the second sub-pixel assemblies, the primary micro-LED and the first replacement micro-LED of each third sub-pixel assembly being defective;
    responsive to identifying the third sub-pixel assemblies:
        physically severing a current path to the primary micro-LED and the first replacement micro-LED in each of the third sub-pixel assemblies, and
        placing a second replacement micro-LED in each of the third sub-pixel assemblies.

2. The method of claim 1, wherein the current is supplied by a driving circuitry.

3. The method of claim 2, wherein placing the primary micro-LED comprises coupling the primary micro-LED to a first terminal of the switch.

4. The method of claim 3, wherein placing the first replacement micro-LED comprises coupling the first replacement micro-LED to a second terminal of the switch.

5. The method of claim 2, wherein physically severing a current path to the primary micro-LED and the first replacement micro-LED comprises creating a laser cut along the current path between the driving circuitry and the first replacement micro-LED.

6. The method of claim 2, wherein placing the second replacement micro-LED comprises coupling the second replacement micro-LED to the driving circuitry.

7. The method of claim 2, wherein identifying the second sub-pixel assemblies further comprises:
    measuring an intensity of light emitted by each of the first sub-pixel assemblies, and
    identifying one or more of the first sub-pixel assemblies emitting light having the intensity lower than a threshold intensity as the second sub-pixel assemblies.

8. The method of claim 2, further comprising:
    programming a memory element coupled to the switch in each of the second sub-pixel to turn off the switch.

9. The method of claim 1, further comprising storing a location of each identified second sub-pixel assembly.

10. The method of claim 1, wherein identifying the third sub-pixel assemblies comprises regulating a driving circuitry to supply the current to the first replacement micro-LED in each of the second sub-pixel assemblies.

11. The method of claim 10, wherein identifying the third sub-pixel assemblies further comprises:
    measuring an intensity of light emitted by each of the second sub-pixel assemblies, and
    identifying one or more of the second sub-pixel assemblies emitting light having the intensity lower than a threshold intensity as the third sub-pixel assemblies.

12. A display device, comprising:
    a first repaired sub-pixel assembly comprising:
        a defective micro-light emitting diode (micro-LED) coupled to a first current source,
        a first operable micro-LED connected to the first current source, and
        a first switch coupled between the first operable micro-LED and the defective LED, the first switch configured to be turned off to disconnect the defective micro-LED from the first current source; and
    a second repaired sub-pixel assembly comprising:
        two defective micro-LEDs connected to a branch of a current path physically severed from a second current source, the branch of the current path connected to a third current source separate from the second current source, and a second operable micro-LED connected to another branch of the current path connected to the second current source.

13. The display device of claim 12, wherein the second repaired sub-pixel assembly comprises a laser cut point severing the second current source from the two defective micro-LEDs.

14. The display device of claim 12, wherein the first repaired sub-pixel assembly comprises a second switch controlled by a control signal to turn on or turn off the first switch.

15. The display device of claim 12, further comprising: an unrepaired sub-pixel assembly comprising:

a third operable micro-LED, and a second switch coupled between the third operable micro-LED and the third current source, the second switch configured to connect the third operable micro-LED to the third current source.

16. The display device of claim 15, wherein a first control signal to control the first switch is reverse of a second control signal to control the second switch.

17. The display device of claim 15, wherein the first repaired sub-pixel assembly comprises a first memory element to control the first switch to turn on or off, and the unrepaired sub-pixel assembly comprises a second memory element to control the second switch to turn on or off.

18. The display device of claim 17, wherein the each of the first memory element and the second memory element comprises a capacitor and a bias pad coupled to the capacitor.

19. The display device of claim 17, wherein the first memory element stores a first bias charge, and the second memory element stores a second bias charge that is reverse of the first bias charge.

20. A display device made by a method comprising:

placing a primary micro-light emitting diode (micro-LED) in each of a plurality of sub-pixel assemblies to create first sub-pixel assemblies;

identifying second sub-pixel assemblies among the first sub-pixel assemblies, the primary micro-LED of each second sub-pixel assembly identified as being defective by at least supplying current via a switch;

responsive to identifying the second sub-pixel assemblies:

turning off the switch to disconnect supply of the current to the primary micro-LED of each second sub-pixel assembly, and placing a first replacement micro-LED in each of the second sub-pixel assemblies;

identifying third sub-pixel assemblies among the second sub-pixel assemblies, the primary micro-LED and the first replacement micro-LED of each third sub-pixel assembly being defective;

responsive to identifying the third sub-pixel assemblies:

physically severing a current path to the primary micro-LED and the first replacement micro-LED in each of the third sub-pixel assemblies, and placing a second replacement micro-LED in each of the third sub-pixel assemblies.

* * * * *